(12) United States Patent  (10) Patent No.: US 8,963,116 B2
Lim et al.  (45) Date of Patent: Feb. 24, 2015

(54) WRAP AROUND PHASE CHANGE MEMORY

(71) Applicant: GLOBALFOUNDRIES Singapore Pte. Ltd., Singapore (SG)

(72) Inventors: Khee Yong Lim, Singapore (SG); Zufa Zhang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 66 days.

(21) Appl. No.: 13/664,412

(22) Filed: Oct. 30, 2012

(65) Prior Publication Data

US 2014/0117301 A1  May 1, 2014

(51) Int. Cl.
 *H01L 47/00* (2006.01)
 *H01L 21/20* (2006.01)
 *G11C 11/00* (2006.01)

(52) U.S. Cl.
 USPC .............. 257/4; 257/536; 438/382; 365/163

(58) Field of Classification Search
 None
 See application file for complete search history.

(56) References Cited

U.S. PATENT DOCUMENTS

| | | | | |
|---|---|---|---|---|
| 7,667,221 | B2 * | 2/2010 | Song et al. | 257/4 |
| 7,670,869 | B2 * | 3/2010 | Yu | 438/95 |
| 2007/0012905 | A1 * | 1/2007 | Huang | 257/2 |
| 2007/0194294 | A1 * | 8/2007 | Song et al. | 257/5 |
| 2010/0001253 | A1 * | 1/2010 | Arnold et al. | 257/4 |
| 2012/0068147 | A1 * | 3/2012 | Chuang et al. | 257/4 |

* cited by examiner

*Primary Examiner* — Andres Munoz
(74) *Attorney, Agent, or Firm* — Horizon IP Pte. Ltd.

(57) ABSTRACT

A device is disclosed. The device includes a top electrode, a bottom electrode and a storage element between the top and bottom electrodes. The storage element includes a heat generating element disposed on the bottom electrode, a phase change element wrapping around an upper portion of the heat generating element, and a dielectric liner sandwiched between the phase change element and the heat generating element.

20 Claims, 15 Drawing Sheets

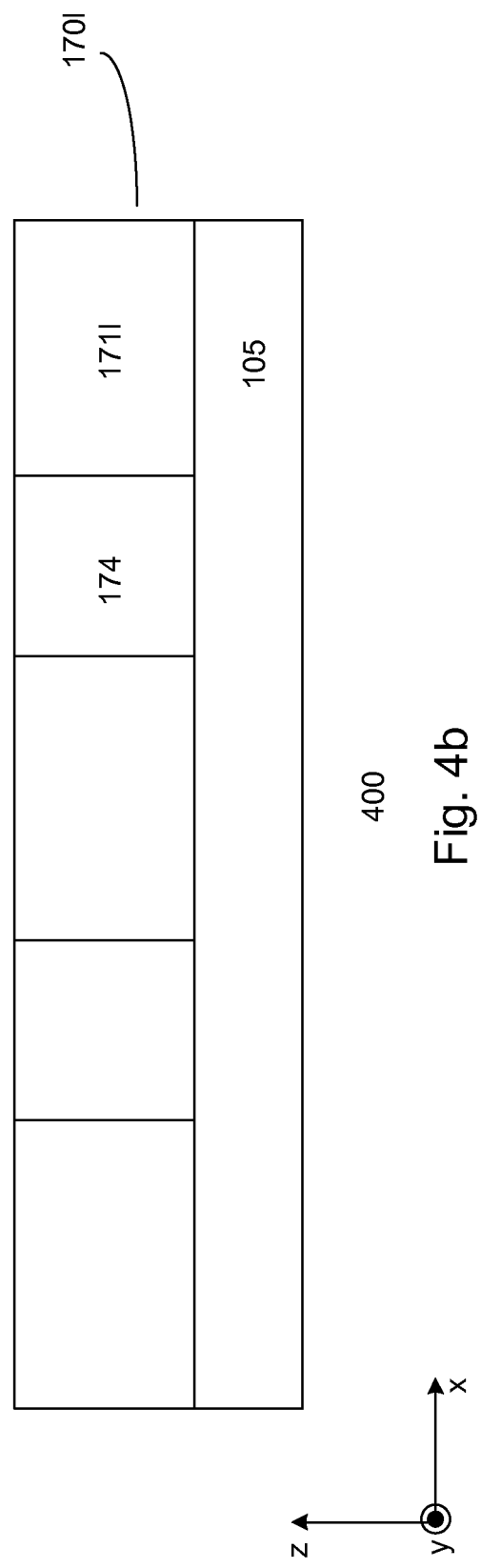

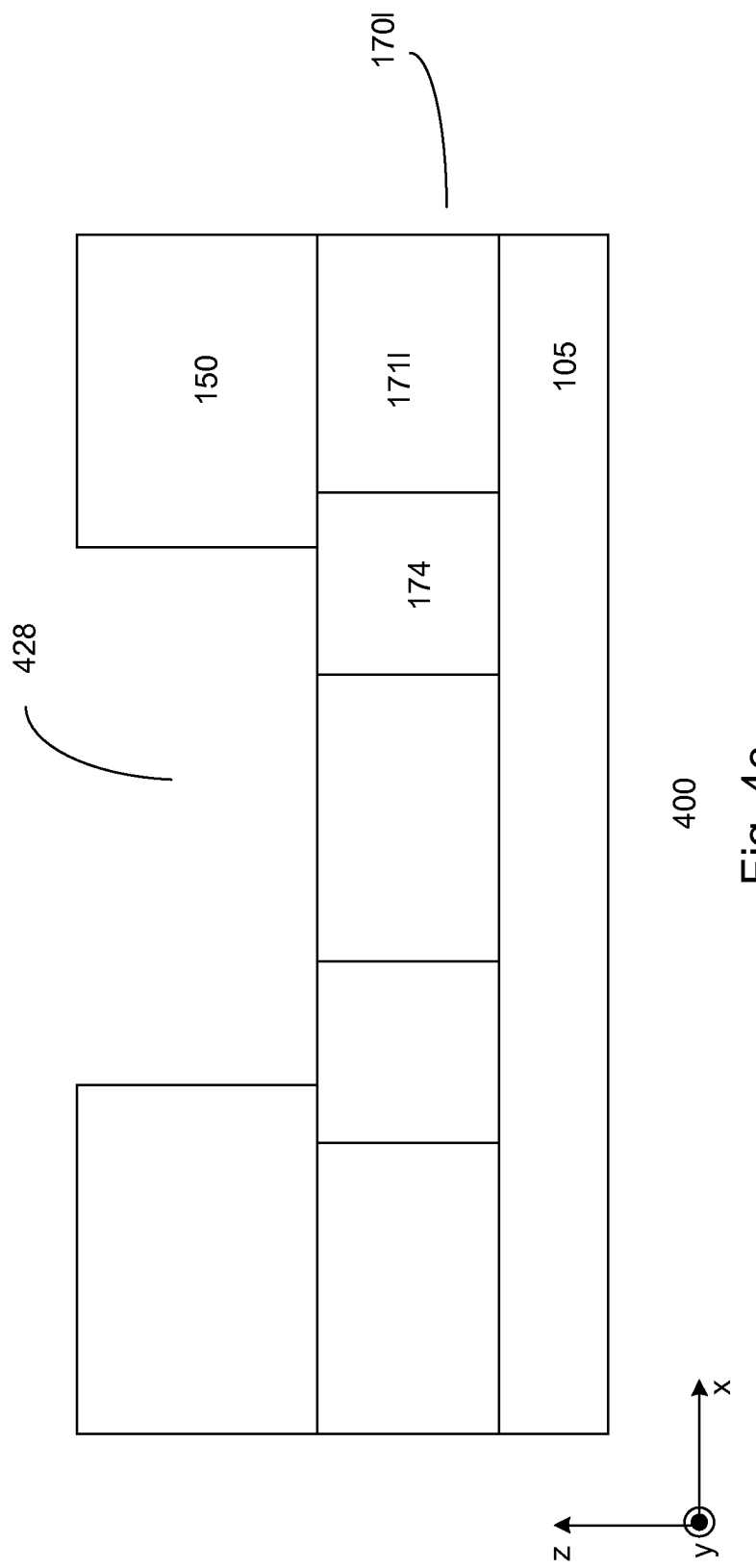

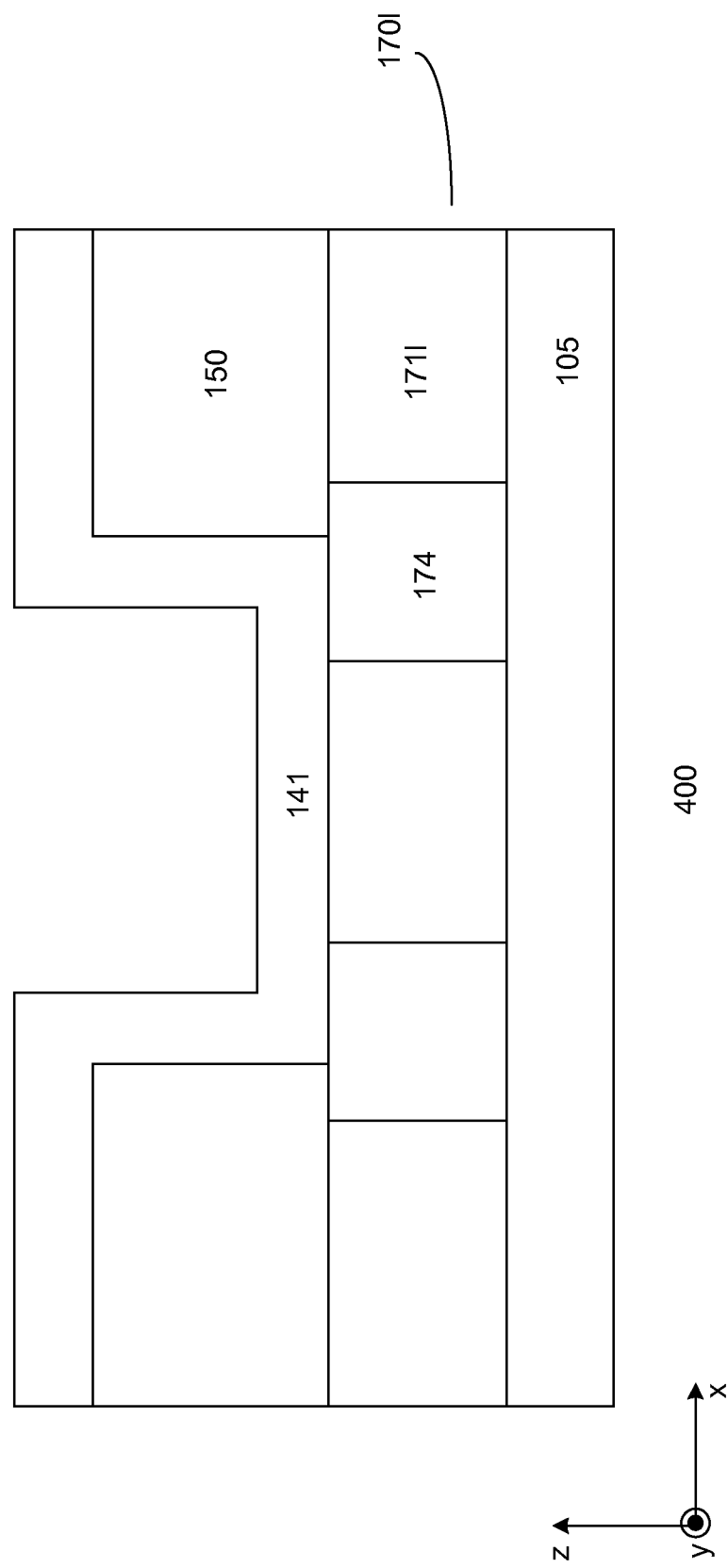

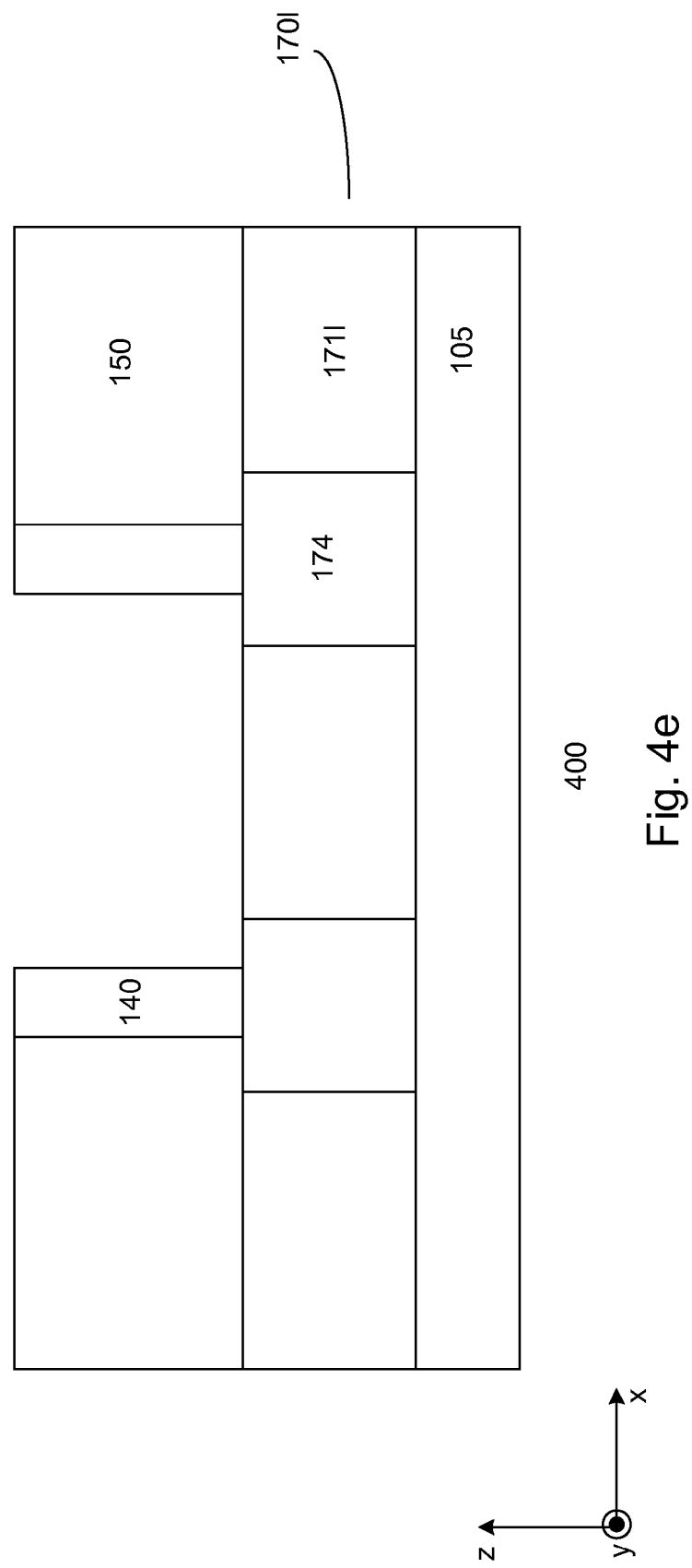

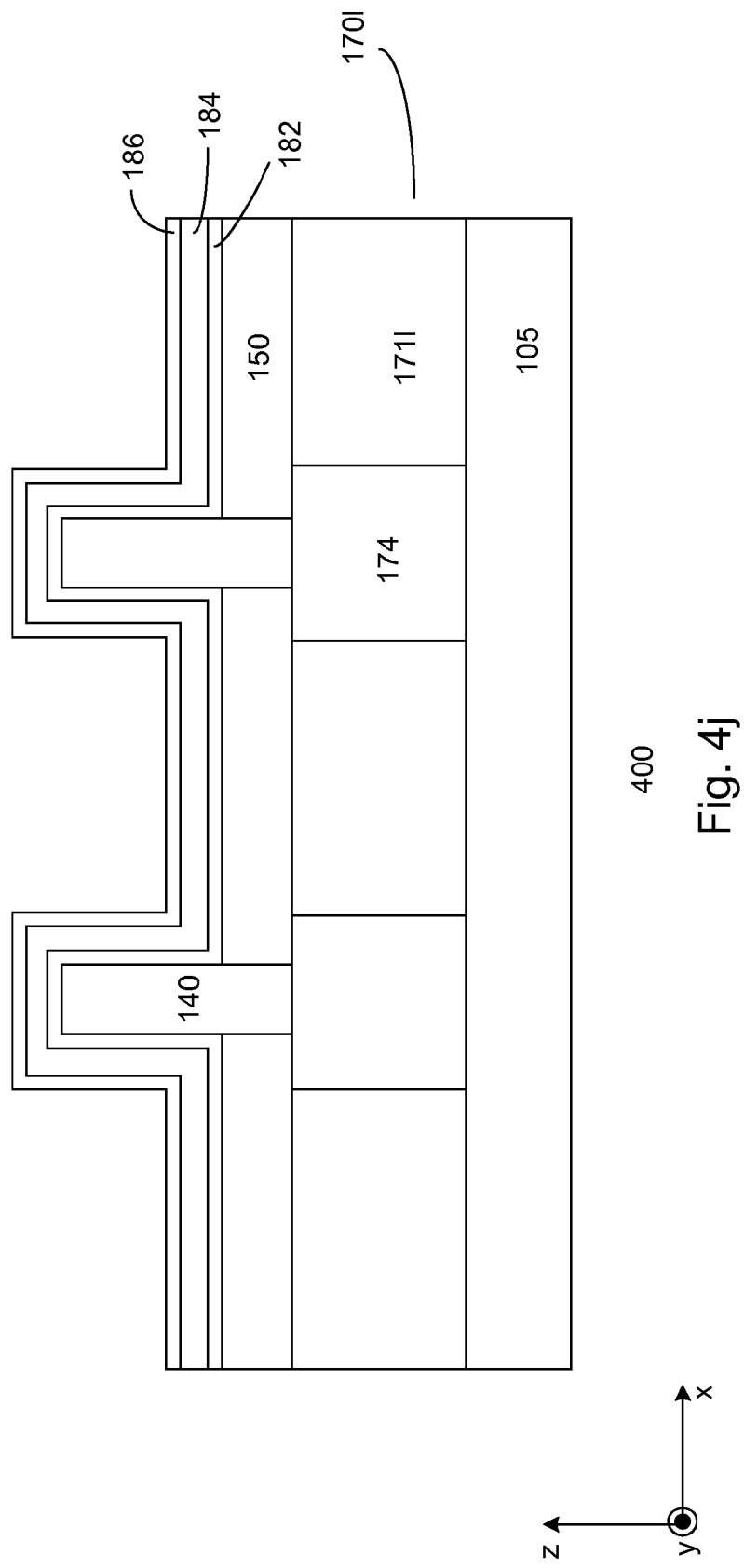

WRAP AROUND PHASE CHANGE MEMORY

BACKGROUND

Non-volatile memory (NVM) has achieved widespread adoptions for code and data storage applications. One type of NVMs is phase change memories which employ phase change materials. The phase change materials may switch between an amorphous phase and a crystalline phase. The memory cell may be programmed by altering the phase of the phase change material. It may be accomplished by applying an electrical current through the phase change material to heat the material.

Therefore, it is desirable to provide a more efficient heating and less thermal crosstalk between neighboring bits of the memory devices.

SUMMARY

An embodiment relates to a device. The device includes a top electrode, a bottom electrode and a storage element between the top and bottom electrodes. The storage element includes a heat generating element disposed on the bottom electrode, a phase change element wrapping around an upper portion of the heat generating element, and a dielectric liner sandwiched between the phase change element and the heat generating element.

In another embodiment, a memory cell is presented. The memory cell includes a selector, a top electrode, a bottom electrode and a storage element between the top and bottom electrodes. The storage element includes a heat generating element disposed on the bottom electrode, a phase change element wrapping around an upper portion of the heat generating element, and a dielectric liner sandwiched between the phase change element and the heat generating element.

In yet another embodiment, a method of forming a device is disclosed. The method includes providing a bottom electrode in a substrate and forming a storage element over the bottom electrode. The storage element includes a heat generating element disposed on the bottom electrode, a phase change element wrapping around an upper portion of the heat generating element, and a dielectric liner sandwiched between the phase change element and the heat generating element. The method also includes forming a top electrode over the storage element.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following
FIGS. 4a-k show cross-sectional views of a process of forming an embodiment of a device.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1A:
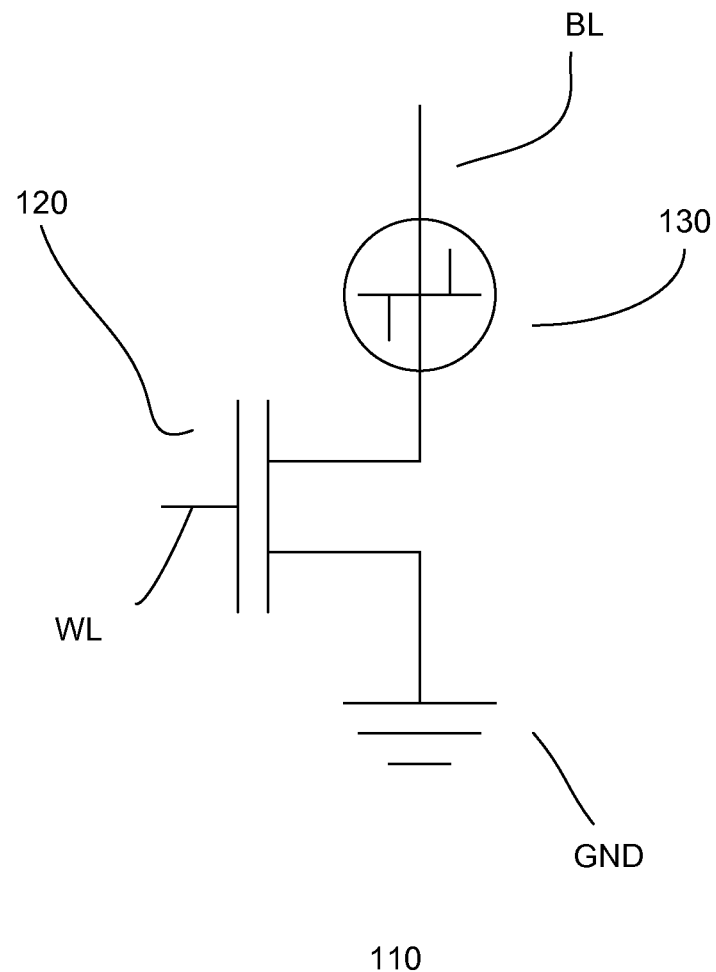
FIGS. 1a-b show schematic views of memory cells.
Figure 1B:
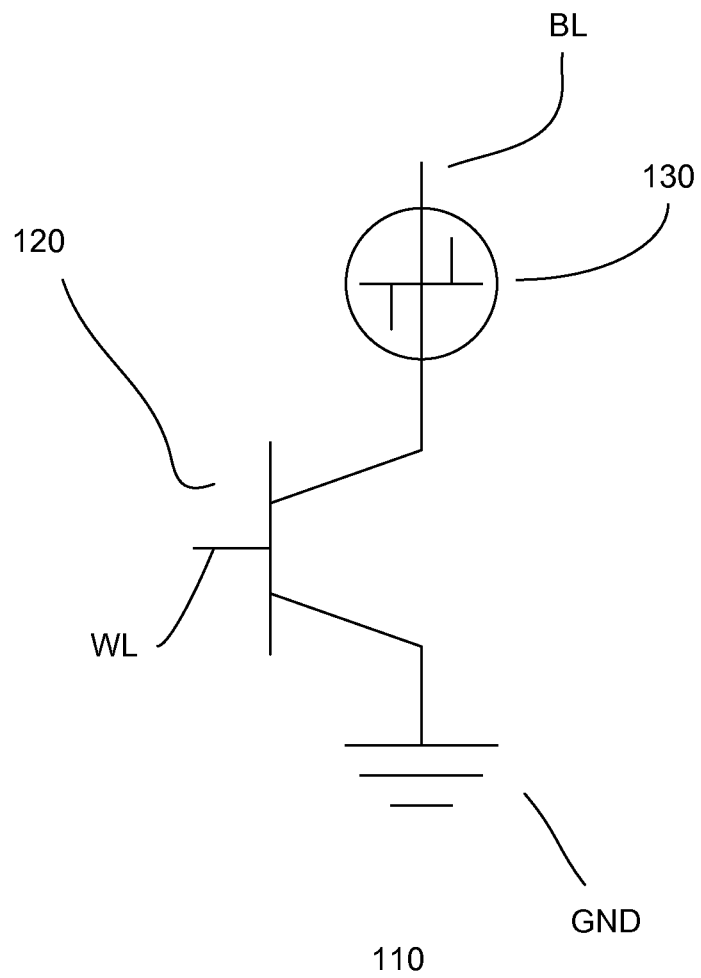

FIGS. 1a-b show schematic views of embodiments of memory cells 110. A memory cell, in one embodiment, includes a selector 120 and a storage element 130. The selector, or selection element, includes first, second and control terminals and the storage element includes first and second terminals. In one embodiment, the first terminal of the selector is coupled to the first terminal of the storage element, the second terminal of the selector is coupled to ground (GND) and the control terminal of the selector is coupled to a wordline (WL). The second terminal of the storage element is coupled to a bitline (BL). The storage element, in one embodiment, is a phase change (PC) storage element, forming a phase change random access memory (PCRAM) cell.

A PC storage element includes a phase change (PC) material. The PC material can be in a first or second state. In one embodiment, the first state is a high resistive state and the second state is a low resistive state. In one embodiment, the high resistive state is an amorphous phase and the low resistive state is a crystalline phase. For example, the amorphous phase or first state represents a logic "0" while the crystalline phase or second state represents a logic "1". Other configurations of data storage for the PC storage element may also be useful.

The PC material may be changed from one phase to the other. In either phase or state, the PC material is stable until reset or set. The PC material, for example, is stable at below a threshold temperature. For example, the threshold temperature is about 85° C. Other threshold temperatures may also be useful and may depend on the type of PC material employed. The PC material may be reset to the amorphous phase from the crystalline phase by exposing it to a reset condition or set from an amorphous phase to the crystalline phase by exposing it to a set condition.

In one embodiment, the set condition includes heating the PC material at its amorphous phase to a crystallization temperature for a sufficient time to transform it to a crystalline phase. On the other hand, the reset condition includes heating to melt the crystalline PC material and rapidly cooling it so it becomes amorphous.

The phase change material, in one embodiment, is formed of a chalcogenide material. In one embodiment, the chalcogenide material is a GeSbTe alloy. In one embodiment, the chalcogenide material is $Ge_2Sb_2Te_5$ (GST). Other types of chalcogenide or phase change materials may also be employed.

The memory cell includes a storage element, storing data or information of the memory cell, such as a logic "1" or a logic "0". In one embodiment, the storage element includes a heat generating (HG) element and a PC element.

In one embodiment, the storage element includes a heat generating (HG) element. The HG element is used to program the PC material. For example, the HG element is used to set and reset the PC material. In one embodiment, the HG material generates heat by, for example, resistive self-heating, when current flows through it. The heat generated, in turn, heats the PC material. The HG material, for example, may be formed of titanium nitride. Other types of HG materials, such as PtSi, NiSi and W, may also be useful.

As shown in FIG. 1a, the selector is a metal oxide semiconductor (MOS) transistor, such as a field effect transistor (FET or MOSFET). The MOSFET may be a fin-type FET, such as a FinFET. Other types of transistors may also be useful. The transistor includes a gate which serves as the control terminal and doped regions adjacent to the gate which serve as first and second terminals. In another embodiment, as shown in FIG. 1b, the selector is a bipolar junction transistor (BJT). The base is coupled to the wordline while one of the collector or emitter terminals serves as the first terminal while the other serves as the second terminal. Other types of selectors may also be useful. For example, a selector may be a diode disposed in series with the storage element 130 between the bitline and wordline. A plurality of memory cells may be interconnected by wordlines and bitlines, forming rows and columns of memory cells of a memory array.

As described, the memory cell is a PCRAM cell. In other embodiments, the memory cell may be a resistive RAM (RRAM) cell. Other types of memory cells may also be useful.

Figure 2:
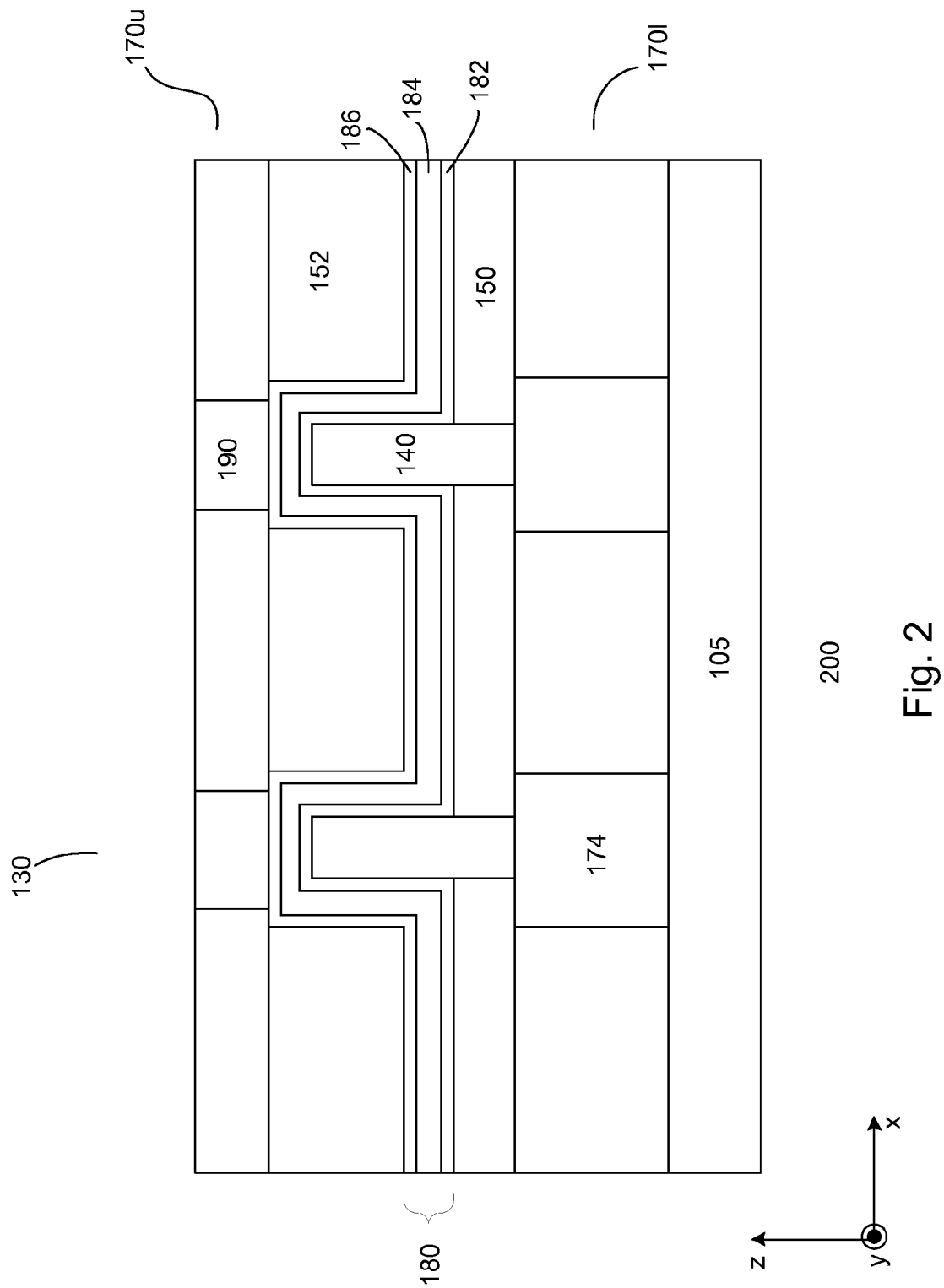
FIG. 2 shows an embodiment of a memory cell.

FIG. 2 shows a cross-sectional view of a portion of a device 200. The portion of the device includes storage elements 130 of memory cells. In one embodiment, the storage elements are phase change storage elements of PCRAM cells. The storage elements are disposed on a substrate 105. The substrate, for example, may be a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

As shown, the portion includes first and second storage elements disposed along a first direction. For example, the first and second storage elements are disposed along the x direction. It is understood that in an array there are many more storage elements of memory cells disposed in both the first and second directions. For example, the storage elements disposed in the x direction form rows of storage elements and in the y direction to form columns of storage elements. The storage elements are connected to wordlines in the row direction and bitlines in the column direction to form an array of memory cells.

A description of a storage element is provided. It is understood that this description applies to storage elements of the array. A storage element includes top and bottom storage electrodes 190 and 174 formed on the substrate. The bottom electrode, for example, is more proximate to the substrate surface than the top electrode. The electrodes are disposed in upper and lower electrode levels 170u and 170l. The memory electrodes may be formed of metal, such as copper or copper alloy. Other suitable types of metals, alloys or conductive materials may also be useful.

The electrodes provide connections to bitlines or wordlines of a memory array. For example, a top electrode is connected to a bitline or a wordline while a bottom electrode is connected to the other of a bitline or a wordline. The electrodes may be directly or indirectly connected to a bitline or a wordline. The electrode connected to a bitline may be directly connected to the bitline. For example, the electrode connected to a bitline may be the bitline conductor connecting a column of memory cells. The electrode connected to a wordline may be indirectly connected to the wordline. For example, the electrode connected to a wordline may be indirectly connected to the wordline via a selection element of the memory cell. The wordline controls the selection element for accessing the memory cell. The selection element may be a transistor, such as a MOSFET, including a FinFET, or a BJT. Other types of selection elements, such as diodes or any self-rectifying diodes/contacts, may also be useful.

Alternatively, the electrode connected to a wordline may be directly connected to the wordline. For example, an electrode connected to a wordline may serve as a wordline conductor connecting a row of memory cells. In the case where both the top and bottom electrodes are directly connected to a wordline and a bitline, a selection element may be provided in series between the wordline and bitline. The selection element, for example, may be a diode. Other types of selection elements may also be useful.

In one embodiment, the top electrode is a second terminal of the storage element which is connected to a bitline and the bottom electrode is connected to a first terminal of the storage element which is connected to a selection element. The top electrode serves as a bitline which is connected to a plurality of storage elements in the y or column direction. As for the bottom electrode, it may be an island electrode which is connected to a first terminal of a selection element. For example, the bottom electrode may be an island electrode connected to a first terminal of a selection element by a contact plug, such as a tungsten plug. Alternatively, the bottom electrode may be a via plug directly coupled to the first terminal of a selection element. Other configurations of top and bottom electrodes may also be useful. For example, the top electrode may be connected to the wordline while the bottom electrode may be connected to the bitline.

Electrodes may be formed in a metal level of an IC. For example, upper and lower electrode levels may correspond to upper and lower metal levels of an IC. The upper and lower metal levels may be adjacent metal levels of an IC. For example, the lower electrode may be disposed in a lower metal level Mi and the upper electrode may be disposed in an upper metal level Mi+1, where i is a metal level of the IC. The lower metal level may be the first metal level, such as M1, while the upper metal level may be the second metal level, such as M2. Providing other metal levels for the lower and upper electrodes, including non-adjacent metal levels, may also be useful. The metal levels may be specifically dedicated to the memory electrodes. The different metal levels are disposed along a third (z) direction. The third direction, for example, is orthogonal to the first and second directions. In some embodiments, the bottom electrodes may be via contacts disposed in the lower electrode level of an IC.

In the case where the lower electrode level is a metal level, it may be disposed on a dielectric layer (not shown). The dielectric layer may be, for example, a silicon oxide ($SiO_2$) dielectric layer. Other types of dielectric layer may also be useful. The dielectric layer isolates the lower electrode level from a component level below. The lower component level may be a metal level in the case where the lower electrode level is not the first metal level. For the case where the lower electrode level is the first metal level, the lower component level is the substrate. The substrate, for example, includes the selection elements as well as other circuit components. The bottom electrode may be indirectly connected to a contact region of a selection element by, for example, a contact plug. In other embodiments, the selection element may be disposed on component levels other than the substrate. In some cases, other types of component levels may be disposed below or above the lower electrode level.

An electrode level includes a plurality of electrodes for a plurality of selection elements. For example, the upper electrode level includes a plurality of top electrodes and the lower electrode level includes a plurality of bottom electrodes. A plurality of bitlines and wordlines interconnect electrodes, directly or indirectly, to form a memory array. For example, wordlines connect the electrodes in the first or x direction while bitlines connect the electrodes in the second or y direction. The first and second directions may be orthogonal. Non-orthogonal first and second directions may also be useful. A wordline forms a row of memory cells and a bitline forms a column of memory cells. The wordlines and bitlines form rows and columns of memory cells of the array. In the case where the electrodes serve as wordlines and bitlines, a cross-point memory array is formed. For a cross-point memory array, selection elements may be provided in series between wordlines and bitlines at the crossing points. Other configurations of electrodes or memory arrays may also be useful.

The electrodes are formed in an intra-electrode dielectric (IED) layer. For example, top memory electrodes are formed in an upper IED layer and bottom memory electrodes are formed in a lower IED layer. The IED layer isolates electrodes of an electrode level from each other. The IED layer, for example, may be an intra-metal dielectric (IMD) layer. In some embodiments, for example, in the case where the lower electrode level is directly coupled to the selection element, the IED layer may also isolate electrodes as well as selection elements and other devices from each other. The IED layer, for example, may be formed of $SiO_2$. Other types of dielectric materials may also be useful. For example, the dielectric layer may be formed of fluorosilicate glass (FSG), polyimides, carbon doped $SiO_2$ and low k dielectrics, such as nanoporous methylsilsesquioxane (MSSQ).

A storage element includes a fin 140 disposed between the top and bottom electrodes. In one embodiment, the fin is disposed on the bottom electrode. The fin serves as a programming element of the PC storage element. In one embodiment, the programming element is a HG element of the PC storage element. As shown, the fin has a width (W) along the y-direction, a length (L) along the x-direction and a height (H) along the z-direction. In one embodiment, a length of the fin is less than a lithographic resolution or definition (e.g., sub-lithographic dimension). For example, the width of the fin may be about 1000 nm. Other widths may also be useful. As for the length, it may be equal to about the lithographic dimension or smaller. The height of the fin, for example, may be about 70 nm. In one embodiment, the distance between outer (non-adjacent) edges of the fins of the memory cell may be equal to the lithographic dimension. Other fin dimensions or distances may also be useful.

A lower portion of the fin is filled with a dielectric layer 150 which may be disposed over the lower electrode level. For example, a lower inter-fin dielectric (IFD) layer fills a lower portion of the fin. The thickness of the lower IFD layer, for example, is about 30 nm. The lower IFD may be formed of the same material as the IED layer. In other embodiments, the lower IFD and IED layers may be formed of different materials. For example, the lower IFD layer may include a low or bad thermal conducting material to reduce heat loss, thus reducing neighboring cell crosstalk and improve HG set and reset efficiency. Other configurations of IED and lower IFD may also be useful.

In one embodiment, a programmable resistive (PR) stack 180 is disposed on the substrate, lining the top of the lower IFD layer and wrapping around the upper portion of the fin. The PR stack, in one embodiment, is a PC stack. As shown, the PC stack is a common PC stack for storage elements along the x-direction. For example, the PC stack is a common PC stack for a row of fins. Other configurations of the PC stack and fins may also be useful.

The PC stack, as shown, includes sequentially a dielectric liner 182, a PC layer 184 and a conductive liner 186. The dielectric liner, for example, may be silicon oxide, the PC layer may be a chalcogenide material while the conductive liner may be TiN, PtSi, W or NiSi. The dielectric liner serves to separate the PC layer from directly contacting the HG fin 140 while the conductive liner serves to prevent oxidation of PC layer 184 and improve performance of the cell. The thickness of the dielectric liner may be about 3 nm, the thickness of the PC layer may be about 20 nm and the thickness of the conductive liner may be about 8 nm. Other PC stacks as well as types of materials and thicknesses for the layers of the PC stack may also be useful. The dielectric liner and conductive liner may serve to create an oxide breakdown path at a top corner of the PC stack for high efficient active area heating.

An upper IFD layer 152 is disposed over the PC stack. The upper IFD layer fills the gaps between the upper portion of the fin and the PC stack over the fin. A top surface of the upper IFD layer is planar with a top surface of the PC stack over the fin. In one embodiment, the upper IFD layer is formed of a bad thermal conductive (BTC) material. A BTC material, for example, may be a low k or porous dielectric material. Other types of BTC material, including air, may also be useful. In other embodiments, the upper IFD layer may be a dielectric material, such as that used for the IED layers. Other types of IFD layers may also be useful. The top of the PC stack contacts the top electrode of the storage element.

As described, the PC layer of the PC stack wraps around the HG element of a storage element. When a high bias is applied to the top electrode, a heating current is generated and localized in a very confined sharp corner of the dielectric liner breakdown path. This increases the efficiency of the active area heating of the PC material.

As described, the memory cell is a PCRAM cell. In other embodiments, the cell structure may be modified to form a RRAM cell. For example, the HG element and PC stack may be modified to form a RRAM cell. In one embodiment, the PC stack may be modified to include a programmable resistive (PR) material. For example, the storage element may be a PR stack or layer. The PR layer, for example, can have filaments formed or broken by subjecting it to a set or reset condition using current. A PR material with broken filaments results in a high resistive state (e.g., logic "0") while a PR material with formed filaments results in a low resistive state (e.g., logic "1"). As for the programming element, it may be modified to pass current to the PR layer to form or dissolve filaments in it. Since a confined high field may be obtained at a top corner of the fin, single columnal filament formation and dissolution may be more efficient and variability issues may be reduced for RRAM cells.

Figure 3:
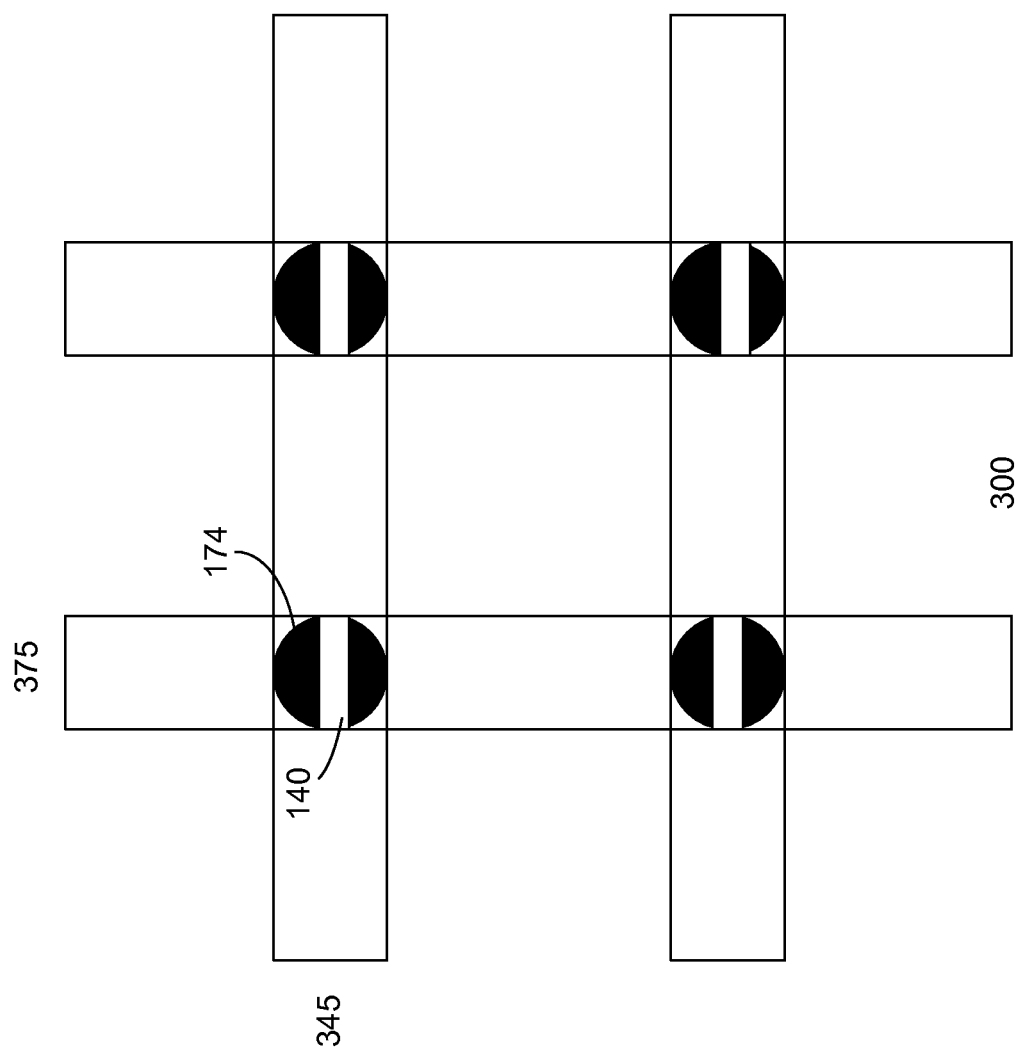
FIG. 3 shows an embodiment of a memory array.

A plurality of the memory cells may be interconnected by WLs and BLs to form a memory array. FIG. 3 shows an embodiment of the memory array 300. WLs may correspond to rows of the array while BLs may correspond to columns of the array. The memory cells in the array may include selectors, for example, BJT/diodes or MOSFETs, including Fin-FETs, which are connected to the memory cell. Other types of devices may also be included. The memory cells in the array may also include the lower metal level 174 and the HG element 140 as illustrated in FIG. 2.

FIGS. 4a-k show cross-sectional views of an embodiment of a process 400 for forming a memory cell. The memory cell, for example, is a part of a memory device. In other embodiment, the memory cell is a part of an IC device. The memory cell, for example, is similar to that described in FIGS. 1a-b. Common elements may not be described or described in detail.

Figure 4A:
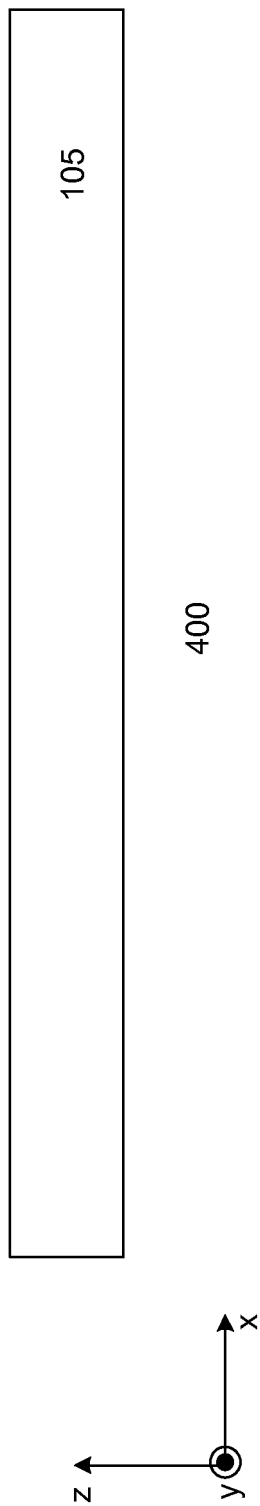

Referring to FIG. 4a, a substrate 105 is provided. The substrate can include a silicon substrate, such as lightly p-type doped substrate. Other types of substrates, including silicon germanium or silicon-on-insulator (SOI), may also be useful.

The substrate is prepared with an array region containing memory cells. In one embodiment, the memory cells include non-volatile memory cells. Other types of memory cells are also useful. The array region includes a doped well (not shown) with dopants of a second polarity type. The doped wells may be intermediately or heavily doped wells. The doped well may serve to isolate cell to cell crosstalk and noise as well as isolate the NVM from other devices on the same substrate. The second polarity type can be n-type or p-type, depending on the memory cell type. The second polarity type wells are used for first polarity type memory cells. For example, n-type wells are used for p-type memory cells while p-type wells are used for n-type memory cells.

Additionally, the substrate may include a logic region (not shown) for support circuitry. The substrate may also include regions for other types of circuitry, depending on the type of device or IC. The different device regions may be isolated from each other by isolation regions. For example, the device regions may be isolated from each other by shallow trench isolation (STI) regions (not shown). Other types of isolation regions may also be useful.

Referring to FIG. 4b, in one embodiment, the substrate is prepared with a lower electrode level 170l. The lower electrode level, for example, includes bottom electrodes 174 formed in a lower IED layer 171l. The lower IED layer may be formed of, for example, silicon oxide. Other types of dielectric materials, such as low k dielectric materials, may also be useful. The lower IED layer, for example, may be formed by CVD. Other techniques, such as sputtering and e-beam, may also be useful. The bottom electrodes, in one embodiment, are island electrodes. Other types of bottom electrodes may also be useful. The lower electrodes may be formed in the lower IED layer by damascene techniques. Other techniques for forming the bottom electrode, such as reactive ion etch (RIE), may also be useful.

In FIG. 4c, a dielectric layer 150 may be deposited over the substrate. In one embodiment, the dielectric layer 150 is formed of the same material as the lower IED layer 171l. In other embodiments, the lower IED and dielectric layer 150 are formed of different materials. For example, the dielectric layer may include a low or bad thermal conducting material. The dielectric layer, for example, may be formed by CVD. Other techniques, such as sputtering and e-beam, may also be useful.

In one embodiment, the dielectric layer is patterned to form a recess 428 above the lower IED layer and bottom electrodes, exposing the lower IED layer between adjacent bottom electrodes and a portion of top surfaces of the bottom electrodes. The patterning of the dielectric layer can be achieved, for example, by mask and etch techniques. For example, a patterned photoresist mask may be used as an etch mask for an anisotropic etch, such as a reactive ion etch (RIE). To improve lithographic resolution, an ARC can be provided beneath the photoresist. Other techniques for patterning the dielectric layer may also be useful. After patterning the dielectric layer, the mask, including the ARC layer, may be removed.

In FIG. 4d, a fin layer 141 is formed on the substrate, lining the bottom and sidewalls of the recess 428 and covering an exposed surface of the ILD. The fin layer, in one embodiment, is formed of TiN. Other heat generating materials which can serve as a heater, such as PtSi, TiW, NiSi and W, may also be useful. The thickness of the fin layer may be about 25 nm. In one embodiment, the fin layer is deposited by sputtering with $TiCl_4$ as a precursor and ammonia or nitrogen as an oxidant at a temperature about 350-500° C.

Referring to FIG. 4e, the fin layer is patterned using an anisotropic etch, such as a RIE. The RIE removes horizontal components of the fin layer, leaving fins 140 disposed on the sidewalls of the recess 428 and on the bottom electrode 174. The fins serve as HG elements of the PC storage elements for setting and resetting a PC material.

Figure 4F:
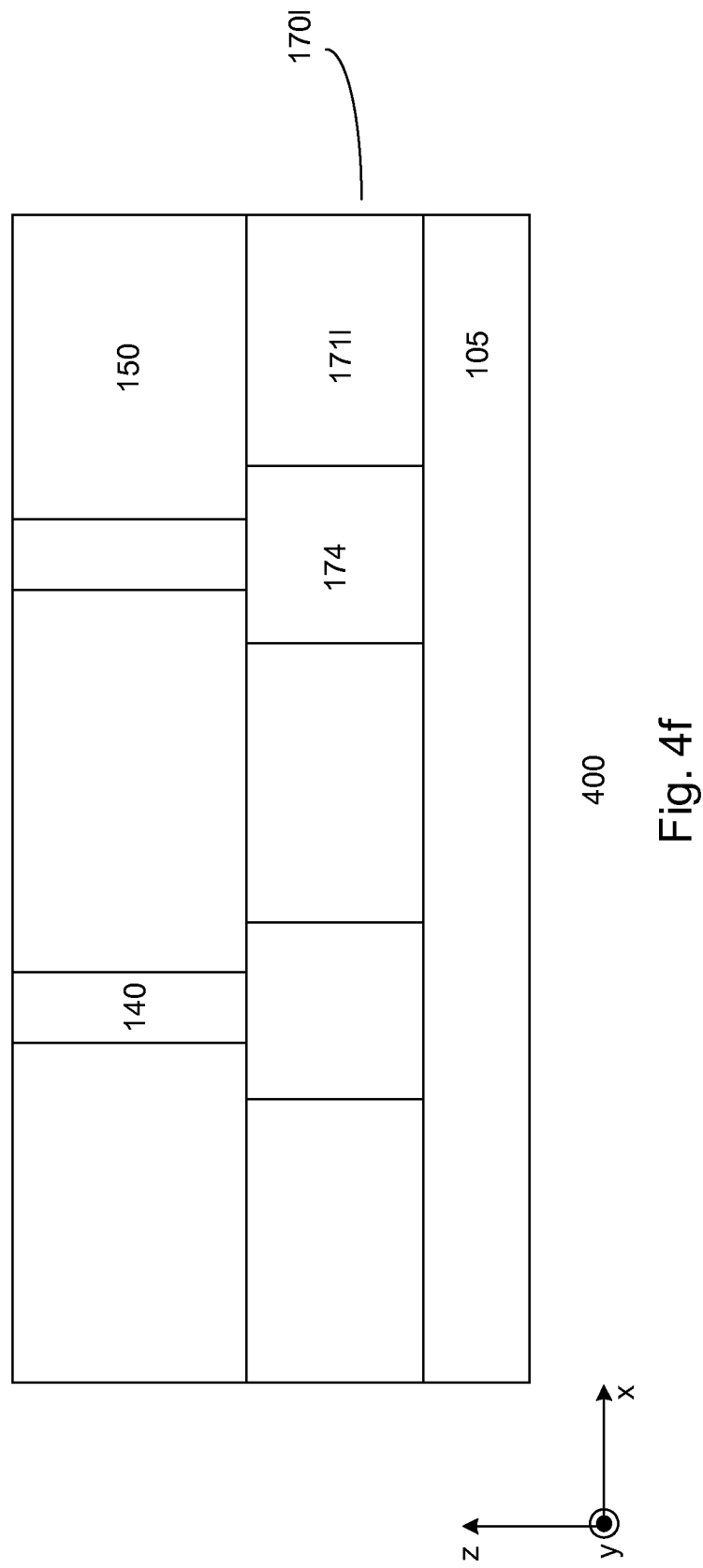

As shown in FIG. 4f, a dielectric layer is deposited on the substrate, filling the opening between the HG elements 140. In one embodiment, the dielectric layer is formed of the same material as the dielectric layer 150. Providing a dielectric layer formed of a different material may also be useful. The dielectric layer, for example, is deposited by CVD. Excess dielectric material is removed by a planarizing process, such as CMP. Other types of planarizing processes may also be useful. The planarizing process forms a planar top surface between the dielectric layers and fins 140.

Figure 4G:
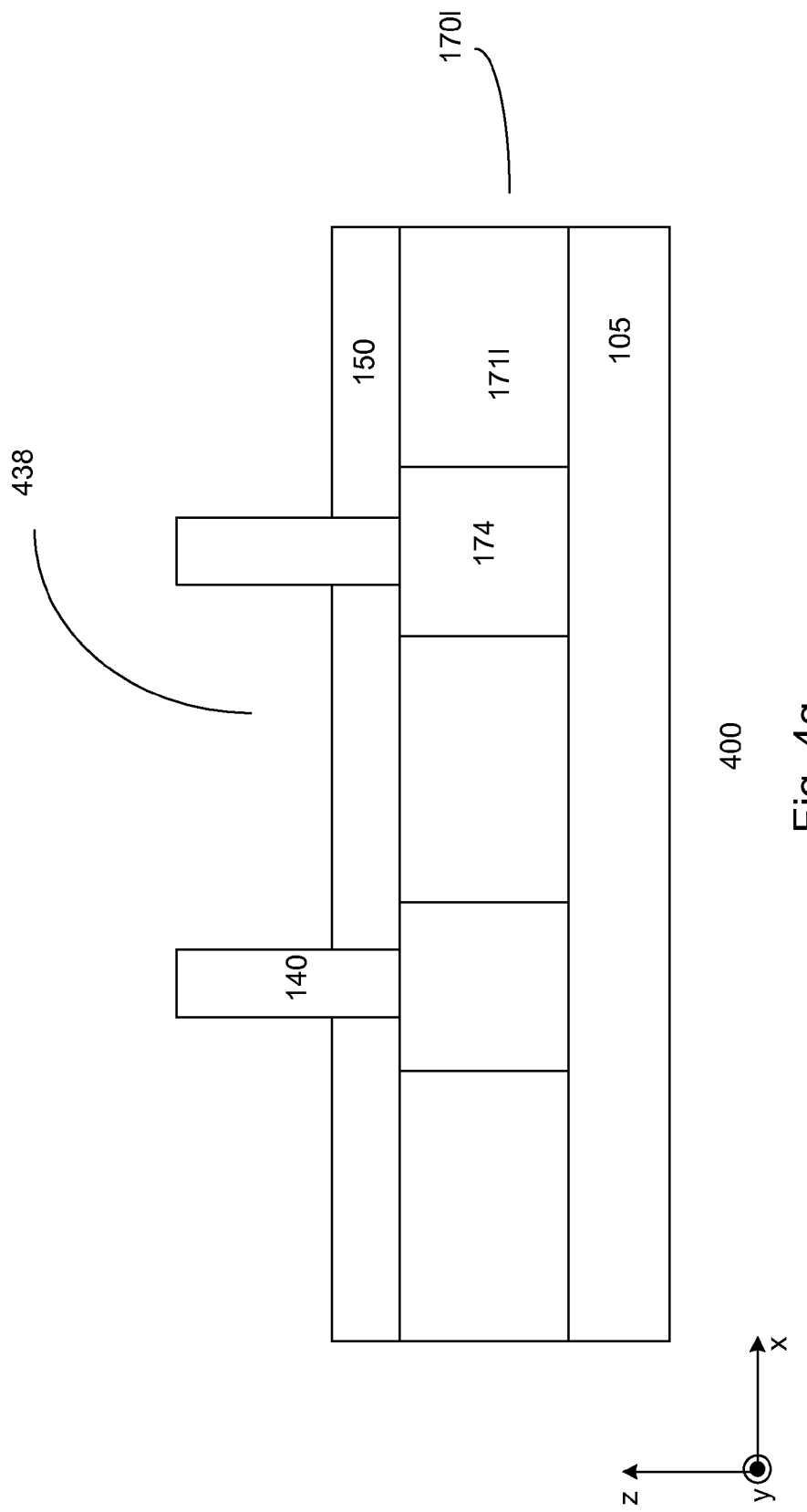

Referring to FIG. 4g, in one embodiment, an etch back process is performed on the dielectric layers to form recesses 438 around the fins 140, exposing a portion of a height of the fins. The depth of the recesses may be 40 nm. The etch back process, for example, may be about 30-40 nm.

Figure 4H:
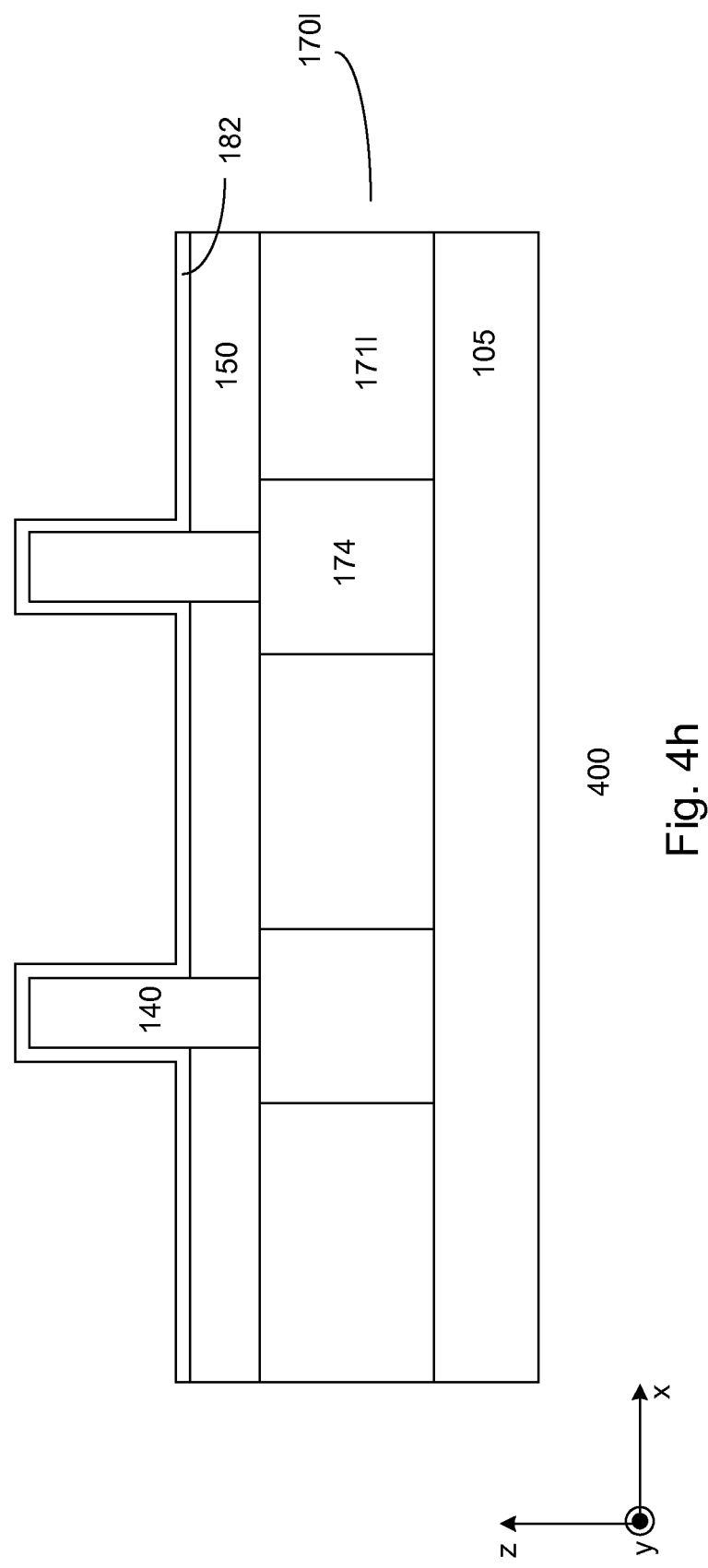

As shown in FIG. 4h, in one embodiment, a dielectric liner 182 is deposited over the substrate, lining the recesses 438 and the exposed surfaces of the fins 140. In one embodiment, the dielectric liner is deposited conformally over the substrate. In one embodiment, the dielectric liner is formed of oxide. The dielectric liner may be formed by LPCVD. The thickness of the dielectric liner may be about 3 nm. Other types of dielectric liners may also be useful. For example, the dielectric liner may be SiON.

Figure 4I:
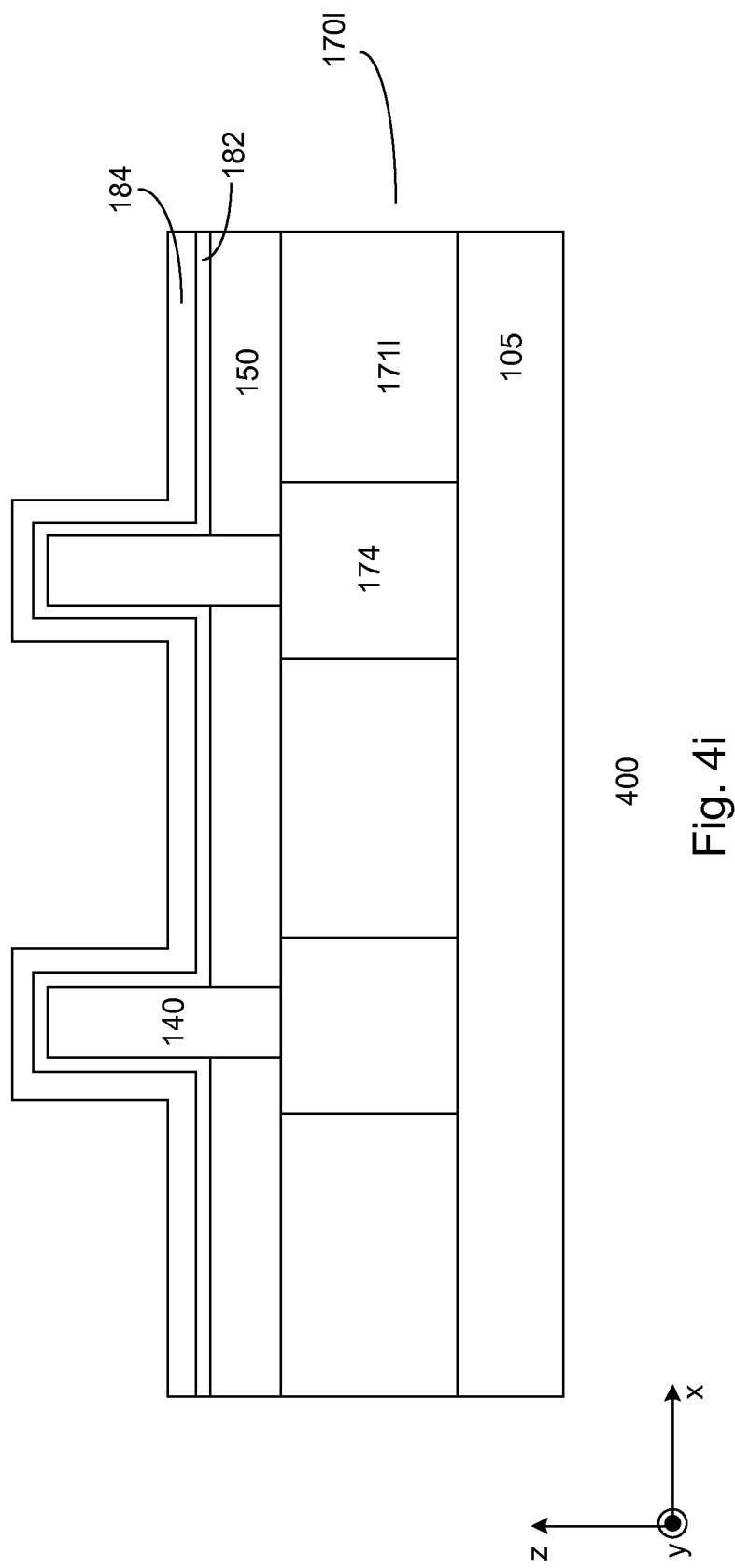

Referring to FIG. 4i, a dielectric layer 184 is formed over the substrate. The dielectric layer covers the dielectric liner 182. In one embodiment, the dielectric layer 184 covers the dielectric liner 182 conformally. The thickness of the dielectric layer 184 may be 20 nm. In one embodiment, the dielectric layer includes a PC layer. The PC layer may include a PC material. The phase change material, in one embodiment, is formed of a chalcogenide material. In one embodiment, the chalcogenide material is a GeSbTe alloy. In one embodiment, the chalcogenide material is $Ge_2Sb_2Te_5$ (GST). Other types of chalcogenide or phase change materials may also be employed. The PC layer may be formed by sputtering. For example, it may be formed by sputtering GST material in a $N_2$ ambient. Other techniques may also be used to form the PC layer.

In one embodiment, as shown in FIG. 4j, a conductive liner 186 is deposited over the substrate. The conductive liner covers the PC layer 184. In one embodiment, the conductive layer covers the PC layer conformally. The thickness of the conductive liner may be 8 nm. The conductive layer may be formed of TiN. Other materials, for example metals, may also be used. The dielectric liner 182, PC layer 184 and conductive liner 186 may form a PC stack of the memory cell.

Figure 4K:
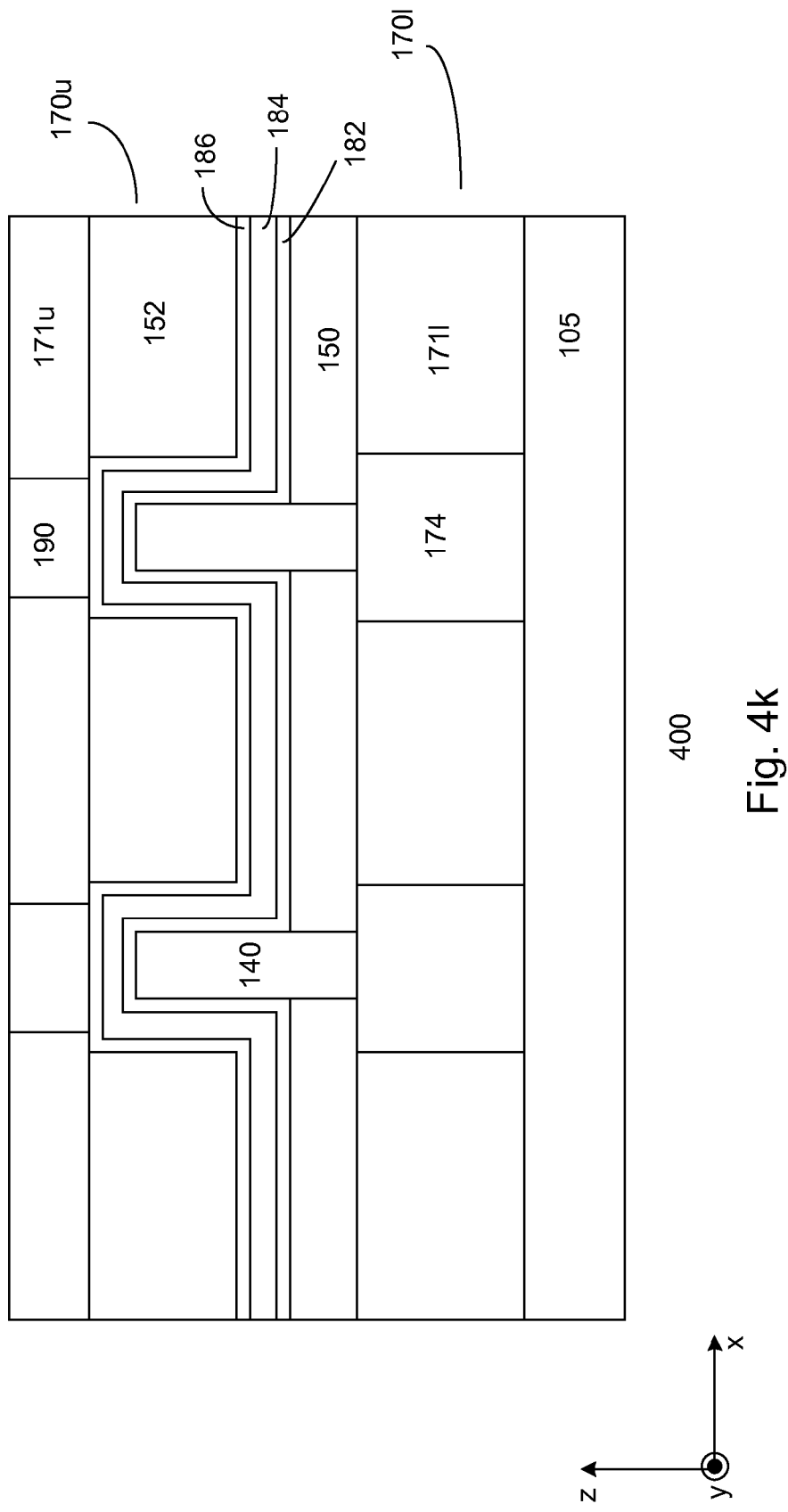

Referring to FIG. 4k, cell patterning may be performed. The cell patterning can be achieved, for example, by mask and etch techniques. For example, a patterned photoresist mask may be used as an etch mask for an anisotropic etch, such as a reactive ion etch (RIE). To improve lithographic resolution, an ARC can be provided beneath the photoresist. Other techniques for patterning the HG or PC layers may also be useful. After patterning the ILD layer, the mask, including the ARC layer, may be removed.

In one embodiment, an upper electrode level 170u is formed. An upper IFD layer 152 is formed over the PC stack. The upper IFD layer fills the gaps between the upper portion of the fin and the PC stack over the fin. A top surface of the upper IFD layer is coplanar with a top surface of the PC stack over the fin. In one embodiment, the upper IFD layer is formed of a bad thermal conductive (BTC) material. A BTC material, for example, may be a low k or porous dielectric material. Other types of BTC material, including air, may also be useful. In other embodiments, the upper IFD layer may be a dielectric material, such as that used for the lower IED layer. Other types of IFD layers may also be useful. The lower IED layer, for example, may be formed by CVD. Other techniques, such as sputtering and e-beam, may also be useful.

In one embodiment, an upper IED layer 171u is formed over the substrate. The upper IED layer may be formed of the same material as the lower IED layer. An upper IED layer of different materials may also be useful. The upper IED layer, for example, may be formed by CVD. Other techniques, such as sputtering and e-beam, may also be useful.

Top electrode contacts 190 may be formed in the upper IED layer on the PC stack. The top electrode contacts may be conductors formed of metal, such as copper or copper alloy. The top electrodes may be formed in the upper IED layer by damascene techniques. Other techniques for forming the top electrode contacts, such as reactive ion etch (RIE), may also be useful.

As described, the process is used to form a PCRAM. The process may be modified to form a RRAM cell. For example, a PR layer may be used instead of a PC layer as well as forming a current conducting programming element instead of a HG element.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a top electrode;
   a bottom electrode; and
   a storage element between the top and bottom electrodes, wherein the storage element comprises
      a heat generating element disposed on the bottom electrode,
      a phase change stack which comprises at least a phase change layer and a dielectric liner sandwiched between the phase change layer and the heat generating element, wherein the phase change layer and the dielectric liner of the phase change stack each wrap around an upper portion of the heat generating element, wherein, the dielectric liner covers the uppermost surface of the heat generating element.

2. The device of claim 1 wherein the phase change stack further comprises a conductive liner disposed over the phase change layer.

3. The device of claim 1 wherein the heat generating element comprises TiN and the phase change layer comprises a chalcogenide material.

4. The device of claim 1 wherein the dielectric liner separates the phase change layer from directly contacting the heat generating element.

5. The device of claim 1 wherein the bottom electrode is disposed in a lower intra-electrode dielectric (IED) layer.

6. The device of claim 5 wherein the top electrode is disposed in an upper IED layer.

7. The device of claim 1 wherein the top and bottom electrodes are disposed in adjacent metal levels.

8. The device of claim 1 further comprising a first dielectric layer disposed over the phase change stack and between upper portions of adjacent heat generating elements.

9. The device of claim 8 wherein the first dielectric layer is formed of low k or porous dielectric materials.

10. The device of claim 1 further comprising a dielectric layer disposed in between lower portions of adjacent heat generating elements.

11. A device comprising:
    a top electrode;
    a bottom electrode;
    a storage element between the top and bottom electrodes, wherein the storage element comprises
       a heat generating element disposed on the bottom electrode,
       a phase change element wrapping around an upper portion of the heat generating element, and
       a dielectric liner sandwiched between the phase change element and the heat generating element;
    a first dielectric layer disposed over the phase change element and between upper portions of adjacent heat generating elements; and
    a second dielectric layer disposed in between lower portions of adjacent heat generating elements, wherein, the dielectric liner covers the uppermost surface of the heat generating element.

12. The device of claim 11 wherein the heat generating element, phase change element and the dielectric liner are disposed over the second dielectric layer.

13. A memory cell comprising:
    a selector;
    a top electrode;
    a bottom electrode; and
    a storage element between the top and bottom electrodes, wherein the storage element comprises
       a heat generating element disposed on the bottom electrode,
       a phase change stack which comprises a phase change layer, a dielectric liner sandwiched between the phase change layer and the heat generating element, and a conductive liner disposed over the phase change layer, wherein each of the layers forming the phase change stack wraps around an upper portion of the heat generating element, wherein, the dielectric liner covers the uppermost surface of the heat generating element.

14. The memory cell of claim 13 wherein the selector comprises a transistor.

15. The memory cell of claim 13 wherein the heat generating element is a fin structure disposed between the top and bottom electrodes.

16. The memory cell of claim 13 wherein the heat generating element comprises TiN.

17. The memory cell of claim 13 wherein the phase change layer comprises a chalcogenide material.

18. The memory cell of claim 13 wherein the bottom electrode is disposed in a lower intra-electrode dielectric (IED) layer.

19. The memory cell of claim 18 wherein the top electrode is disposed in an upper IED layer.

20. The memory cell of claim 13 wherein the top and bottom electrodes are disposed in adjacent metal levels.

* * * * *